United States Patent
Kujirai et al.

(10) Patent No.: US 7,649,256 B2
(45) Date of Patent: Jan. 19, 2010

(54) SEMICONDUCTOR CHIP HAVING POLLISHED AND GROUND BOTTOM SURFACE PORTIONS

(75) Inventors: Hiroshi Kujirai, Tokyo (JP); Kiyonori Oyu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 176 days.

(21) Appl. No.: 11/176,642

(22) Filed: Jul. 8, 2005

(65) Prior Publication Data

US 2006/0006528 A1 Jan. 12, 2006

(30) Foreign Application Priority Data

Jul. 12, 2004 (JP) .............................. 2004-204845

(51) Int. Cl.
*H01L 21/30* (2006.01)
(52) U.S. Cl. ................. 257/730; 438/459; 257/E21.23; 257/E21.237
(58) Field of Classification Search ................. 257/730; 438/459
See application file for complete search history.

(56) References Cited

U.S. PATENT DOCUMENTS

| | | | |
|---|---|---|---|
| 6,787,797 B2* | 9/2004 | Demizu et al. ................ | 257/48 |
| 6,913,526 B2* | 7/2005 | Honda ........................ | 451/232 |
| 7,016,557 B2* | 3/2006 | Deutsch et al. ............... | 385/14 |
| 2001/0004544 A1* | 6/2001 | Schoenfeld .................. | 438/460 |
| 2003/0038343 A1* | 2/2003 | Hasegawa .................... | 257/620 |
| 2003/0207496 A1* | 11/2003 | Hasegawa .................... | 438/110 |
| 2004/0022477 A1* | 2/2004 | Deutsch et al. ............... | 385/14 |

FOREIGN PATENT DOCUMENTS

JP 2000-124177 4/2000

\* cited by examiner

*Primary Examiner*—Alexander G Ghyka
(74) *Attorney, Agent, or Firm*—McGinn IP Law Group, PLLC

(57) ABSTRACT

A semiconductor chip having a thickness of 130 micrometers or less includes a mechanically ground bottom surface corresponding to a central circuit area, and a polished bottom surface corresponding to a peripheral scribe area. The mechanically ground bottom surface prevents heavy metals attached onto the bottom surface of the wafer from diffusing toward the source/drain regions of the semiconductor substrate and thereby from degrading the transistor characteristics.

14 Claims, 11 Drawing Sheets

SEMICONDUCTOR CHIP HAVING POLLISHED AND GROUND BOTTOM SURFACE PORTIONS

BACKGROUND OF THE INVENTION (a) Field of the Invention

The present invention relates to a semiconductor device having a semiconductor chip suited to a multi-chip package structure.

(b) Description of the Related Art

In recent years, for achieving smaller dimensions for an electronic equipment such as portable data assistant and digital camera, electronic components mounted therein are requested to have higher mounting densities. For achieving a higher mounting density in the thickness direction of the electronic equipment in particular, it is desired to reduce the thickness of semiconductor chips.

In one example of conventional techniques for reducing the thickness of a semiconductor chip, the process includes the steps of fabricating semiconductor transistor elements, interconnections, interlevel dielectric films and a protective film on a wafer, mechanically grinding the bottom surface of the resultant wafer to a desired thickness thereof, and dividing the wafer into a plurality of semiconductor chips having the desired thickness.

However, the mechanical grinding process significantly reduces the mechanical strength of the wafer. The factors of reduction of the mechanical strength of the wafer includes a reduced thickness of the wafer and mechanical damages such as scratches formed on the bottom surface of the wafer during the mechanical grinding process. The damage on the bottom surface may eventually grow and enter the internal of the wafer to form a crack therein. The damages on the bottom surface of the wafer, which reduce the mechanical strength of the semiconductor chip, reduce the product yield of the semiconductor chips divided from the wafer.

A technique for improving the mechanical strength of the wafer is described in, for example, Patent Publication JP-A-2000-124177, wherein the entire bottom surface of the wafer is polished with a finer degree of polishing to remove the damages formed on the bottom surface during the preceding mechanical grinding process.

In general, a process for forming a multi-chip package structure including a plurality of stacked chips uses the technique as described above, wherein each chip is polished to a thickness as small as 100 micrometers ($\mu$m) or less, for example.

The technique described in the patent publication improves the mechanical strength of the resultant semiconductor chips. However, there arises another problem wherein the semiconductor chip manufactured using the above technique suffers from degradation of characteristics of transistor elements in the semiconductor chip. The degradation of the characteristic is considered to occur in the manner as described below.

The mechanical grinding on the bottom surface of the wafer allows a minute amount of heavy metals to be attached onto the bottom surface. The heavy metals thus attached are scarcely removed by the succeeding polishing. According to the experiments conducted by the present inventors revealed that the copper attached onto the bottom surface of the wafer after the mechanical grinding process could be reduced only by an amount of $1\times10^{11}$ atoms/cm$^2$ at most after the succeeding polishing, to leave a significant amount of heavy metals on the bottom surface. The problem caused by the heavy metals occurs in the packaging process for the semiconductor chip.

The packaging process for fabricating the semiconductor package from the semiconductor chip will be described with reference to a lead-on-chip (LOC) type thin-film-outline-package (TSOP). First, a set of leads attached with a LOC tape is bonded onto a semiconductor chip, the LOC tape including an insulation sheet coated with resin on both surfaces thereof. Subsequently, these leads and the electrodes on the semiconductor chip are connected together via bonding wires by using a wire bonding technique. The semiconductor chip, wires and leads are then encapsulated in thermo-setting resin for packaging. The packaging step includes a baking treatment for curing the resin on the LOC tape at a temperature of 150 degrees C. for 30 hours and at a temperature of 230 degrees C. for 90 minutes, and another baking treatment for curing the package resin at a temperature of 180 degrees C. for several tens of minutes to several hours.

The baking treatments, or heat treatments, allow the heavy metals attached onto the bottom surface of the semiconductor chip to diffuse into the internal of the chip. Copper having a highest diffusion rate among the heavy metals attached onto the chip diffuses within the internal of the chip along a distance of several hundreds of micrometers during the heat treatments. This means that the heavy metals such as copper attached onto the bottom surface of the silicon substrate may reach the top surface of the chip during the heat treatments in the packaging step. The heavy metals, if reaches the active layer of the transistors formed in the vicinity of the top surface of the semiconductor chip, degrade the transistor characteristics in the chip.

Assuming that the semiconductor chip is a DRAM chip, for example, the heavy metal reaching depletion layers of the source/drain regions configures an impurity level within the energy bandgap to generate a junction leakage current. A higher junction leakage current degrades the refreshing characteristic of memory cells in the DRAM chip.

It is noted here that in the semiconductor chip manufactured by the conventional process including the mechanical grinding step without a subsequent polishing step, the damages such as scratches formed on the bottom surface of the semiconductor chip have a function of gettering the heavy metals therein. More specifically, the damages suppress the heavy metals from diffusing within the semiconductor chip during the heat treatments in the packaging process by the gettering function thereof.

Thus, it will be understood that the polishing treatment for removing the mechanical damages, if conducted after the grinding treatment, improves the mechanical strength of a semiconductor chip having a small thickness and yet degrades the transistor characteristics. On the contrary, the damages, if they are left after the grinding treatment without effecting the polishing treatment, suppress degradation of the transistor characteristics and yet degrades the mechanical strength. In short, the improvement of mechanical strength and the suppression of degradation of the transistor characteristics are trade-offs in a thin semiconductor chip used in a multi-chip package structure.

SUMMARY OF THE INVENTION

In view of the above, it is an object of the present invention to provide a semiconductor device having an improved mechanical strength and capable of suppressing degradation in the transistor characteristics caused by diffusion of heavy metals, which are attached onto the bottom surface of the semiconductor chip during a mechanical grinding process.

The present invention provides a semiconductor device including a semiconductor substrate including a central circuit area having a semiconductor active layer and a peripheral scribe area encircling the central circuit area, the peripheral scribe area having a bottom surface having a surface roughness lower than a surface roughness of a bottom surface of the central circuit area.

The present invention also provides a method for manufacturing a semiconductor device including: forming on a wafer a plurality of semiconductor chips each including a central circuit area having a semiconductor active layer and a peripheral scribe area encircling the central circuit area; mechanically grinding a bottom surface of the wafer to form a ground bottom surface; and polishing a portion of the ground bottom surface disposed in the peripheral scribe area, leaving another portion of the ground bottom surface in the central circuit area.

In accordance with the present invention, the bottom surface of the central circuit area of the semiconductor chip has a function of gettering heavy metals from diffusing toward the active layer of the central circuit area to thereby improve transistor characteristics in the central circuit area, whereas the bottom surface of the peripheral scribe area prevents the damage from growing to form a crack to thereby improve the mechanical strength.

The above and other objects, features and advantages of the present invention will be more apparent from the following description, referring to the accompanying drawings.

PREFERRED EMBODIMENT OF THE INVENTION

Now, the present invention is more specifically described with reference to accompanying drawings.

Figure 1:
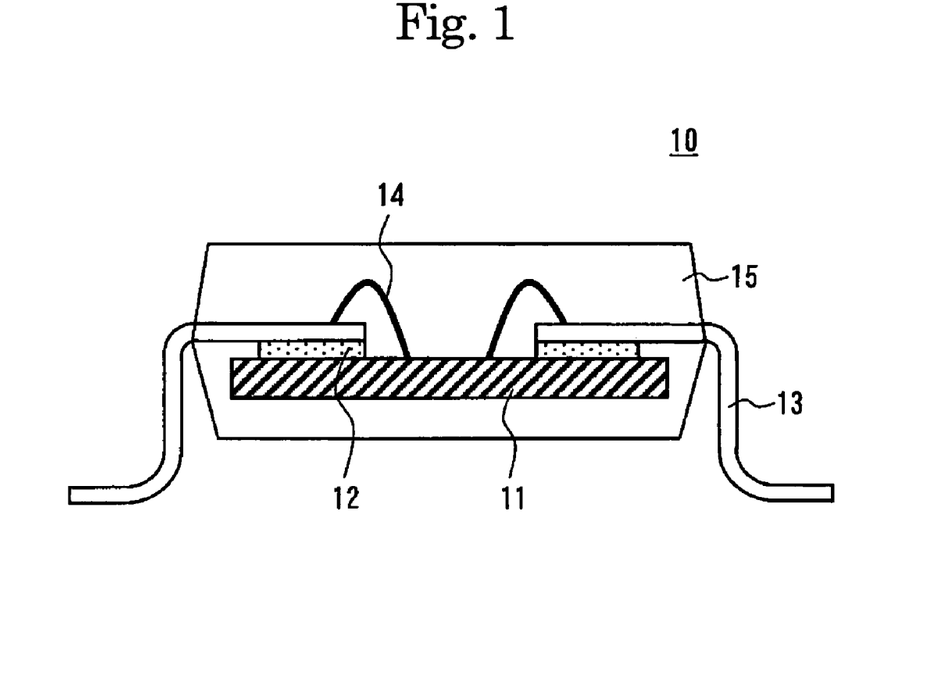
FIG. 1 is a sectional view of a semiconductor package according to a first embodiment of the present invention.

Referring to FIG. 1, a semiconductor package, generally designated by numeral 10, according to a first embodiment of the present invention includes a semiconductor chip 11, a set of leads 13 bonded onto the semiconductor chip 11 with an intervention of a LCO sheet 12, a plurality of wires 14 for connecting together electrodes (not shown) of the semiconductor chip and the leads 13, and an encapsulating resin body 15 encapsulating therein the semiconductor chip 11, part of leads 13 and wires 14. The semiconductor package 10 is configured as a LOC type TSOP. The ends of the leads 13 exposed from the encapsulating resin body 15 are bent to form external terminals. The encapsulating resin body 15 is made from thermo-setting resin.

Figure 2:
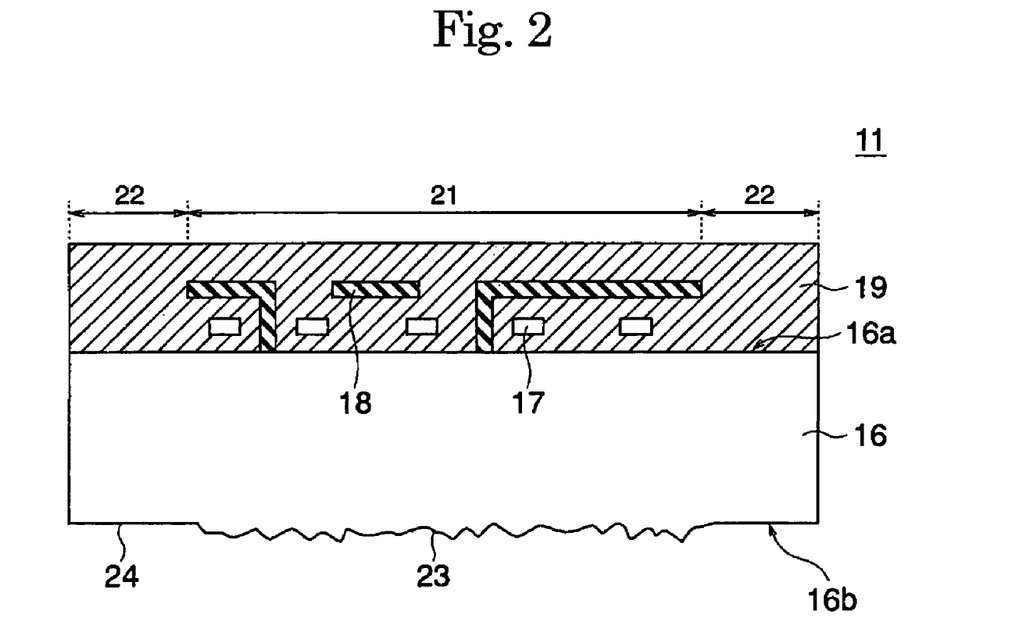
FIG. 2 is a enlarged sectional view of the semiconductor chip shown in FIG. 1.

The semiconductor chip 11 configures a DRAM chip, which includes, as shown in FIG. 2, a silicon substrate 16, a semiconductor circuitry formed thereon and including plurality of transistors 17, interconnections 18 and interlevel dielectric films 19, and a protective film (not shown) covering the semiconductor circuitry. The transistors 17 may be MIS (metal-insulator-semiconductor) transistors, connected to capacitors and covered with, for example, a polyimide coat together with the capacitors. The silicon substrate 16 includes therein source/drain regions (not shown) for the MIS transistors 17, the source/drain regions having a depth of about 10 micrometers. The transistors 17 and interconnections 18 are formed in a central circuit area 21 of the semiconductor chip 11, which is encircled by a peripheral scribe area 22 having a width of about 25 micrometers.

Figure 3:
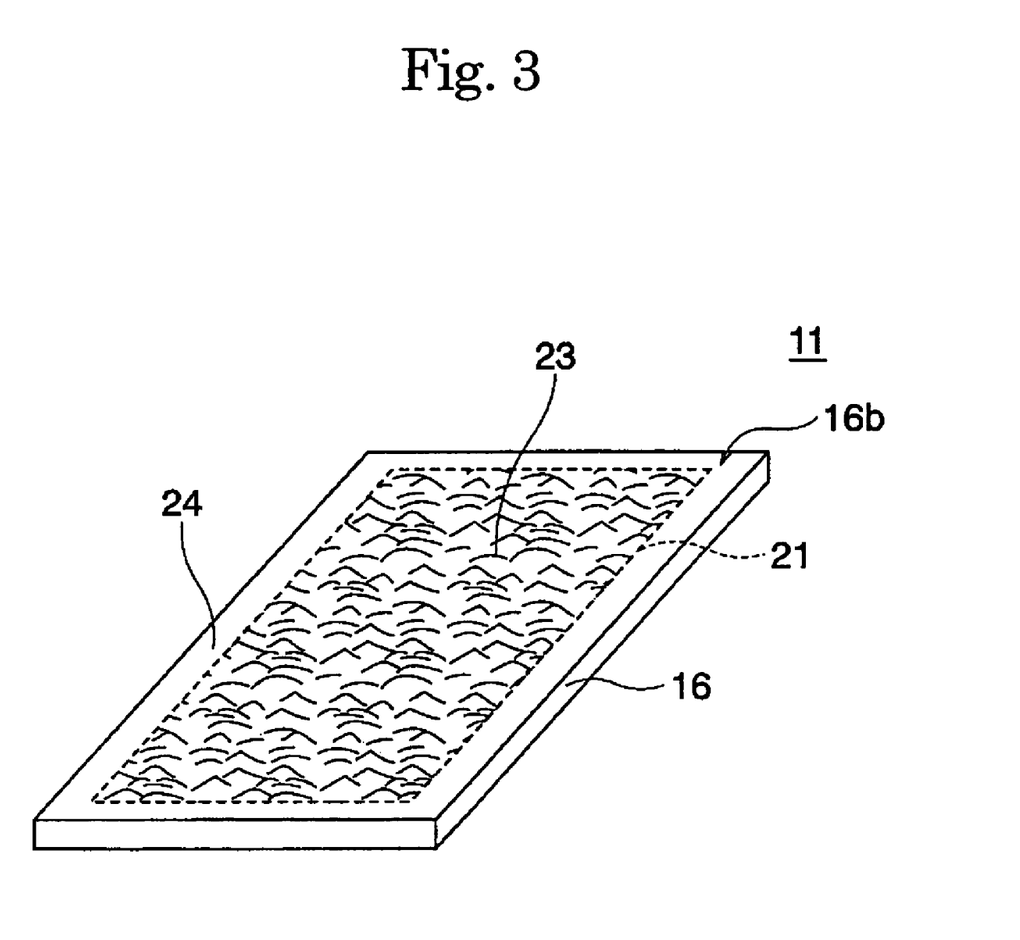
FIG. 3 is a schematic perspective view of the semiconductor chip of FIG. 2 as viewed from the bottom surface thereof.

FIG. 3 schematically shows the bottom surface of the semiconductor chip 11. The bottom surface of the silicon substrate 16 has a mechanically ground surface 23 at the bottom of the central circuit area 21 and a polished surface 24 at the bottom of the peripheral scribe area 22. The mechanically ground surface 23 has a central-line surface-average-roughness (Ra) of about 0.1 micrometer whereas the polished surface 24 has an Ra of about 10 nanometers (nm). The semiconductor chip 11 has a thickness of about 100 micrometers in the central circuit area 21, and a thickness of about 98 micrometers in the peripheral scribe area 22. The layered structure including the transistors 17, interconnections, interlevel dielectric films and protective film, which are formed on the silicon substrate, has an overall thickness of 7 micrometers.

In the semiconductor package 10 of the present embodiment, the mechanically ground surface 23 formed on the bottom of the central circuit area 21 of the silicon substrate 16 prevents the heavy metals attached onto the bottom surface of the silicon substrate 16 from diffusing toward the source/drain regions during the heat treatments in the packaging process of the semiconductor package. This reduces the junction leakage current flowing across the p-n junctions of the source/drain regions, thereby suppressing degradation in the refreshing characteristic of the memory cells. The polished surface 24 formed on the bottom of the peripheral scribe area 22 removes the damages caused by the mechanical grinding, preventing the growth of scratches, which may grow from the peripheral scribe area toward the central circuit area. Thus, the semiconductor chip has an improved mechanical strength.

Figure 4:
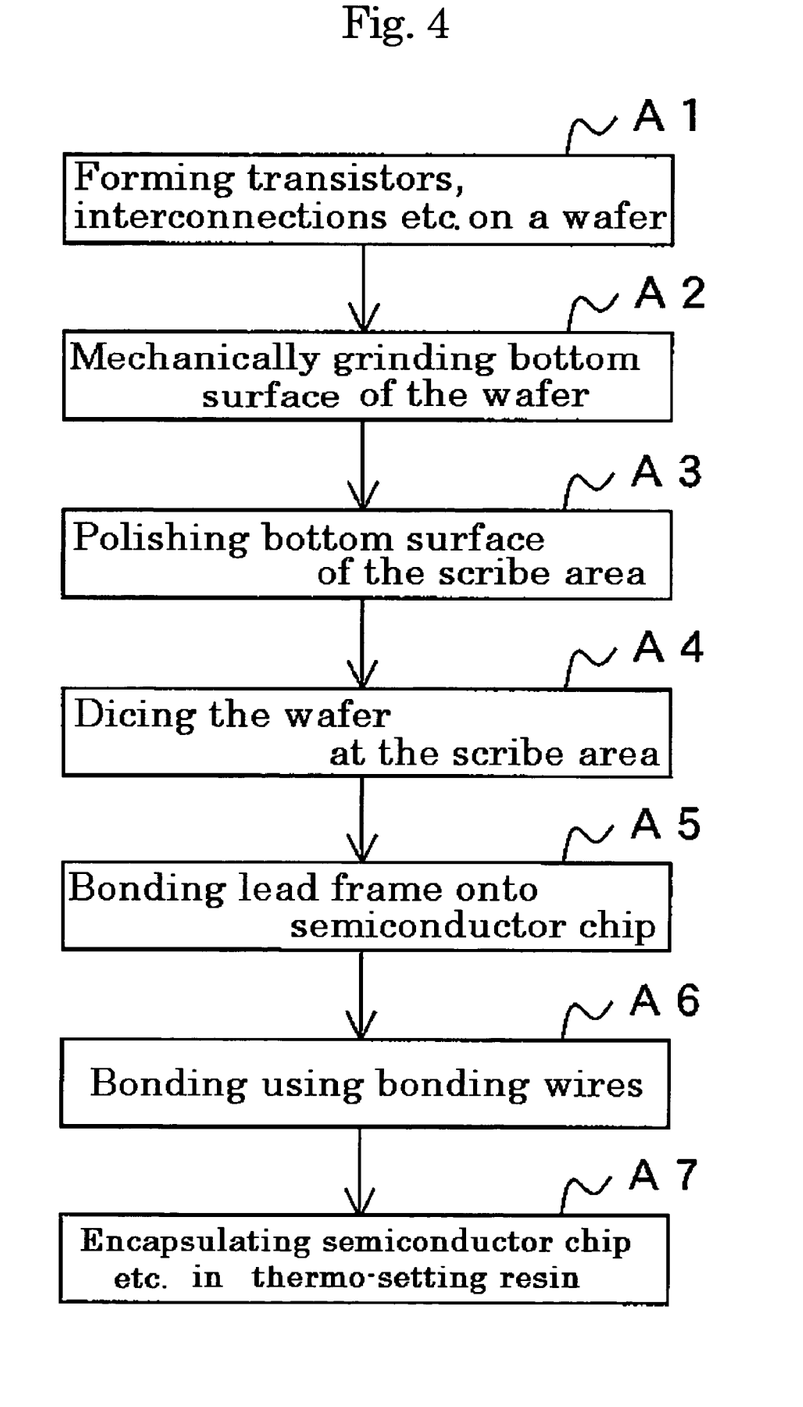
FIG. 4 is a flowchart of a process for fabricating the semiconductor package of FIG. 1.

FIG. 4 shows a procedure for manufacturing the semiconductor package 10 of FIG. 1. First, MIS transistors 17, interconnections 18, interlevel dielectric films 19 and protective film are formed on the silicon substrate 16 (step A1). The step of forming the MIS transistors 17 includes ion-implantation for forming source/drain regions on the top surface of the silicon substrate 16. The silicon wafer 20 used herein has a diameter of 300 mm, for example.

Figure 5:
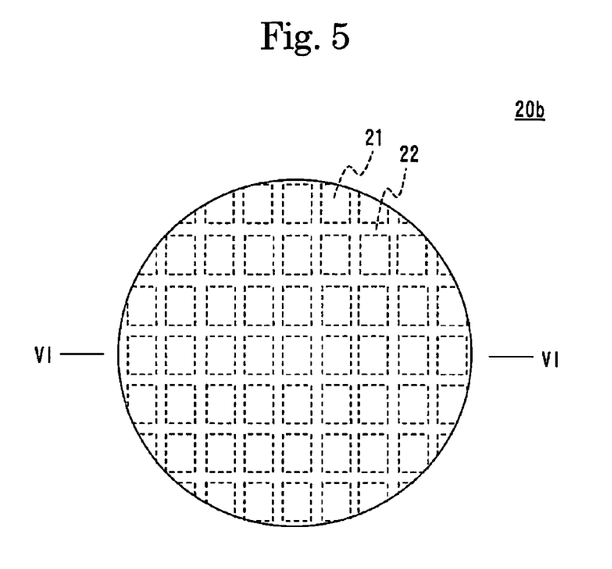
FIG. 5 is a bottom view of the wafer in one step of the process shown in FIG. 4.

Subsequently, the top surface of the wafer 20 is covered with a protective sheet, followed by mechanically grinding the bottom surface 20b of the wafer as shown in FIG. 5 (step A2). This mechanical grinding is effected as a coarse grinding step using a grinding surface having a grain size of about 300, to thereby obtain a thickness of 300 to 750 micrometers for the wafer 20. Thereafter, a fine mechanical grinding is conducted using a grinding surface having a grain size of about 200 to obtain a thickness of 100 micrometers for the wafer 20 including the transistor elements, interconnections, interlevel dielectric film and protective film. After the protective sheet is removed from the wafer 20, a cleaning step is conducted using water to remove particles attached onto the bottom surface 20b of the wafer during the mechanical grinding.

Figure 6:
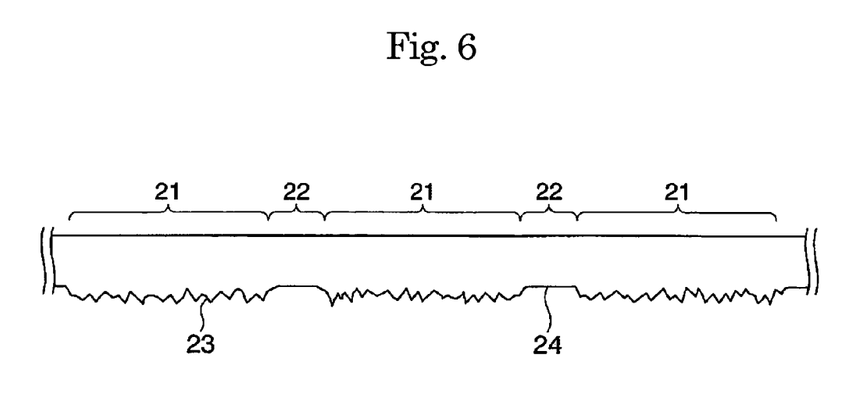
FIG. 6 is a sectional view of the wafer in another step of the process shown in FIG. 4.

Subsequently, the bottom surface 20b of the wafer is subjected to polishing (step A3). The polishing step is conducted only in the bottom of the peripheral scribe area 22 encircling the central circuit area of each chip in the wafer shown in FIG. 5. The sectional view of the wafer 20b after the polishing step is shown in FIG. 6, wherein the bottom surface of the peripheral scribe area 22 is formed as a polished fine surface 24, with the bottom of the central circuit area 21 being left as a mechanically-ground coarse surface 23. Thereafter, another protective sheet is bonded onto the bottom surface of the wafer 20, followed by dicing the wafer 20 at the scribe area 22 to obtain a plurality of chips 11 shown in FIGS. 2 and 3 (step A4).

A lead frame including a set of leads and attached with a LOC tape is maintained at a temperature of 150 degrees C., and bonded onto each semiconductor chip 11, with the LOC tape sandwiched between the leads and the semiconductor chip 11 (step A5). Subsequently, a two-step baking treatment is conducted consecutively at a temperature of 150 degrees C. for 30 minutes and at a temperature of 230 degrees C. for 90 minutes, thereby curing the resin of the LOC tape. A wire bonding step is then effected at a temperature of 150 degrees C. for connecting together electrodes on the semiconductor chip 11 and the leads 13 by using wires 14 (step A6). The chip 11 is then received in a metallic cavity maintained at a temperature of 180 degrees C. and encapsulated with thermo-setting resin introduced in the metallic cavity (step A7). The metallic cavity receiving therein the chip and the resin is maintained at the temperature of 180 degrees C. for several tens of minutes to sufficiently cure the thermo-setting resin to obtain a package resin body.

Figure 7:
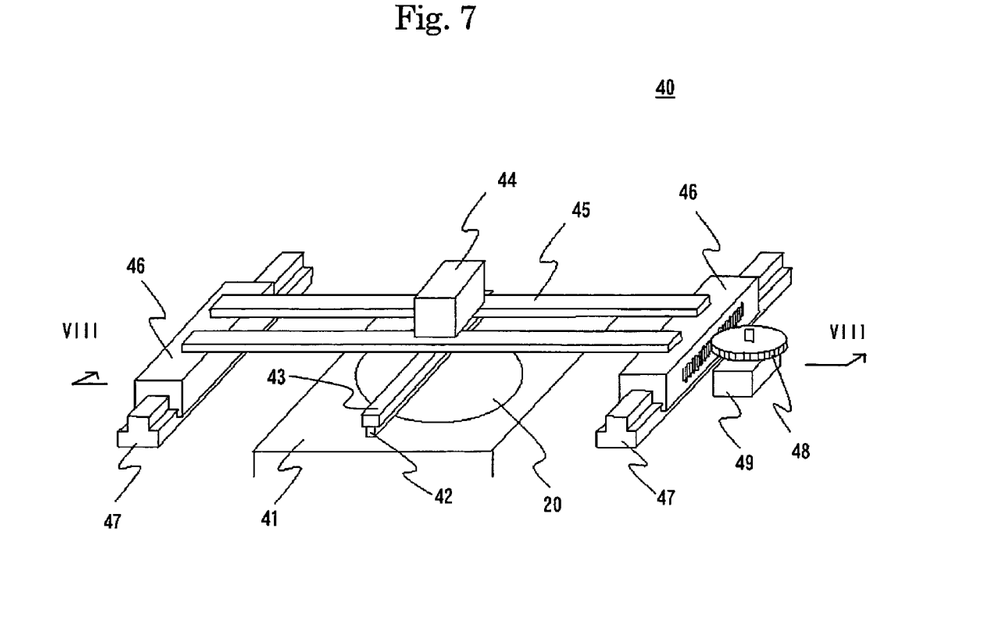
FIG. 7 is a perspective view showing a polishing system used for polishing the wafer in the process of FIG. 4.

FIG. 7 shows an example of a polishing system for polishing the wafer in the polishing step. The polishing system 40 includes a wafer stage 41 mounting thereon a wafer 20, a polishing pad 42 having a rectangular polishing surface, a polishing head 43 mounting thereon the polishing pad 42, a pressure control box 44 coupled to the top of the polishing head 43 to control the pressure applied onto the wafer 20 by the polishing pad 42, a pair of support members 45 fixing thereon the pressure control box 44, a table 46 supporting the support members 46 at both the ends thereof, a pair of guide rails 47 guiding the table 46, and a drive motor reciprocally driving the table 46 via a gear 48, with a small distance at a time.

Figure 8:
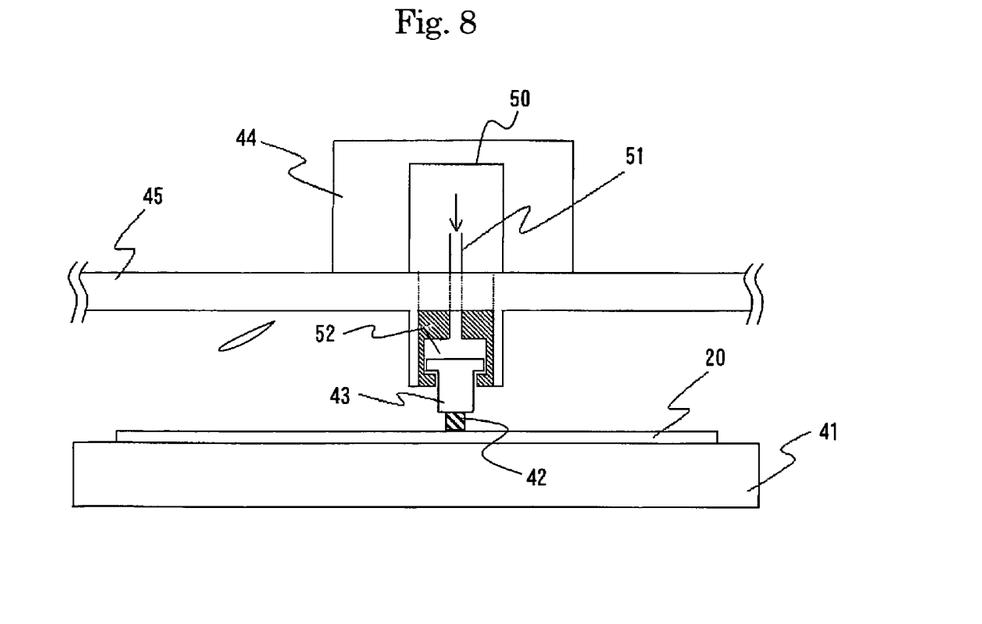
FIG. 8 is a vertical sectional view of the wafer as viewed in the direction of VIII-VIII shown in FIG. 7.

FIG. 8 shows the detail of the polishing system 40 in a vertical sectional view as viewed in the direction shown by VIII-VIII in FIG. 7. The pressure control box 44 includes a compressed-air supply chamber 50 which receives compressed air from outside the chamber 50, a cylinder 52 supplied with compressed air from the compressed-air supply chamber 50 via an air supply tube 51 to depress the polishing pad 42 of the polishing head 43 onto the wafer 20. The pressure control box 44 controls the pressure applied onto the wafer 20 via the polishing head 43, by controlling the pressure inside the compressed-air supply chamber 50. In the present embodiment, the polishing pad 42 is made of polyurethane resin, which polishes the wafer 20 by using a dry polishing technique without using a slurry, or polishing liquid. The polishing surface of the polishing pad 42 is of a rectangle having a length of 300 mm and a width of 82 micrometers. The width, 82 micrometers, corresponds to the width, 80 micrometers, of the scribe area 22 added with a margin of 2 micrometers for the alignment between the polishing pad 42 and the wafer 20.

Figure 9:
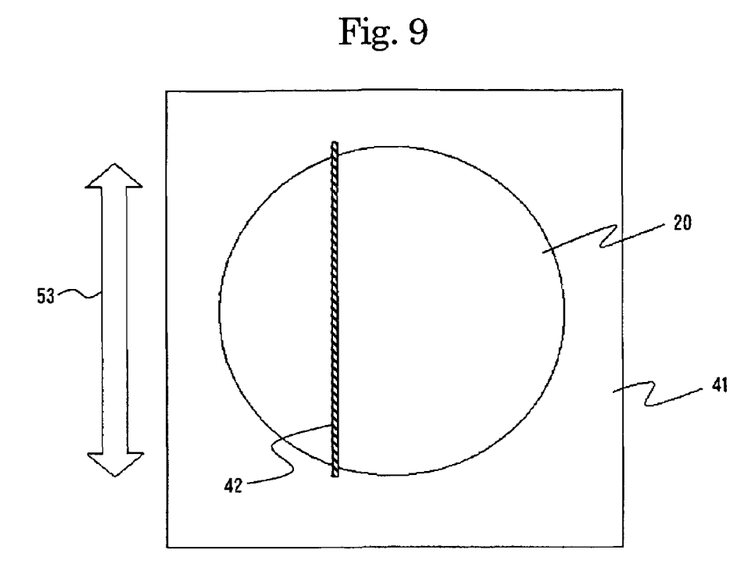
FIG. 9 is a top plan view showing the step of polishing the wafer by using the polishing system of FIG. 7.

FIG. 9 depicts the polishing step using the polishing system 40, wherein the wafer 20 is mounted on the wafer stage 41, with the bottom surface of the wafer 20 being directed upward. The polishing pad 42 is moved in a reciprocal oscillating movement along the longitudinal direction of the polishing pad 42, as shown by a double-headed arrow 53. The polishing pad 42 is reciprocally moved at a speed of 40 mm/sec., in a distance of 10 mm at a time to obtain a polished thickness of 2 micrometers for the wafer 20. The polishing step is effected at the scribe areas 22 extending in one direction, then at the other scribe areas 22 extending in a direction normal to the one direction, after rotating the wafer 20 by 90 degrees. The dry polishing step may be replaced by a wet polishing step, known as a chemical-mechanical polishing wherein slurry is supplied onto the bottom of the wafer 20 during the polishing.

In the method of the present embodiment, as described above, the bottom of the peripheral scribe area 22 is polished with the bottom of the central circuit area 21 being left as a mechanically-ground surface, which has a function of gettering therein the heavy metals. The gettering function prevents the heavy metals attached onto the bottom surface 20b of the wafer 20 during the curing step or wire boding step from diffusing toward the source/drain regions of the silicon substrate. It should be noted here that the polishing system and the polishing step in the present embodiment are recited only as examples, and that a variety of alterations and modifications can be made therefrom.

Figure 10:
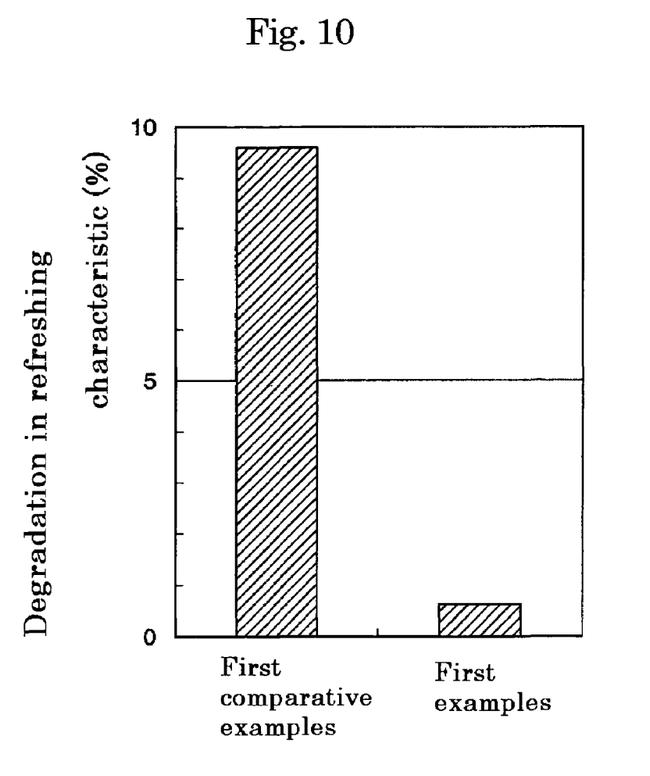
FIG. 10 is a graph showing degradation in the refreshing characteristic of DRAMs of the first examples and first comparative examples.

Samples of the semiconductor package 10 as described above were manufactured as first examples of the present invention, and other samples were also manufactured as first comparative examples, which were subjected to a polishing treatment over the entire bottom surface of the wafer 20. The refreshing characteristics of the first examples and first comparative examples were investigated to obtain the graph of FIG. 10. The percentage of devices degraded in the refreshing characteristic is plotted on the ordinate for the first examples and the first comparative examples. As understood from FIG. 10, the first examples of the semiconductor package 10 of the present invention exhibited a percentage degradation in the refreshing characteristic as low as 0.7% whereas the first comparative examples exhibited a percentage degradation in the refreshing characteristic as high as about 9.5%. Thus, it was confirmed that the present invention reduced the degradation in the refreshing characteristic of the semiconductor memory devices formed as first examples of the present invention.

The first examples also revealed that the present embodiment reduced the number of semiconductor packages which suffered from the shortage of a mechanical strength caused by the polishing treatment on the bottom surface of the semiconductor chip, as compared to the semiconductor packages which were not subjected to the polishing treatment. Thus, the present invention can improve the product yield of the semiconductor packages with respect to the mechanical strength.

Investigation by the present inventors revealed that the semiconductor packages subjected to the polishing treatment over the entire bottom surface of the semiconductor chip suffered from the degradation of the refreshing characteristic if the silicon substrate has a thickness of 130 micrometers or smaller, especially a thickness of 100 micrometers or smaller. Thus, the present invention is effective if the silicon substrate has a thickness of 130 micrometers or smaller, and more effective if the silicon substrate has a thickness of 100 micrometers or smaller.

Figure 11:
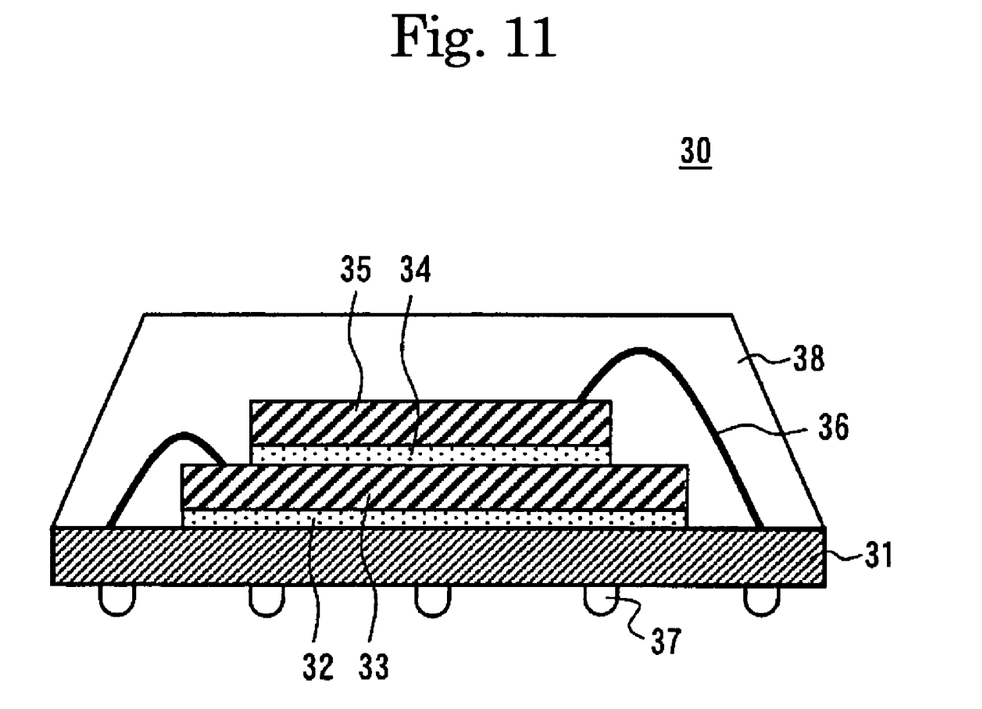
FIG. 11 is a sectional view of a semiconductor package according to a second embodiment of the present invention.

FIG. 11 shows a semiconductor package according to a second embodiment of the present invention. This package is configured as a fine-pitch ball-grid-array (FBGA) MCP. The FBGA MCP 30 includes a FBGA substrate 31, a first semiconductor chip 33 mounted on the FBGA substrate 31 with an intervention of a bonding tape 32, and a second semiconductor chip 35 mounted on the first semiconductor chip 32 with an intervention of another bonding tape 34. The bonding tape 32 or 34 includes an insulator sheet applied with resin on both sides thereof.

Electrodes formed on the first semiconductor chip 33 and the second semiconductor chip 35 are connected to electrodes formed on the FBGA substrate 31 via bonding wires 36. The FBGA substrate 31 mounts on the bottom surface thereof external terminals 37 configured as solder bumps, which are to be mounted on electrodes of a printed circuit board such as mother board. The first and second semiconductor chips 33 and 35, bonding tapes 32 and 34 and bonding wires are encapsulated in a thermo-setting resin body 38.

The first semiconductor chip 33 configures a DRAM chip, whereas the second semiconductor chip 35 configures a logic circuit chip. The first semiconductor chip 33 has a configuration similar to that of the semiconductor chip 11 in the first embodiment, whereby the first semiconductor chip 33 has an improved suppression capability against the degradation in the refreshing characteristic and has an improved mechanical strength.

Figure 12:
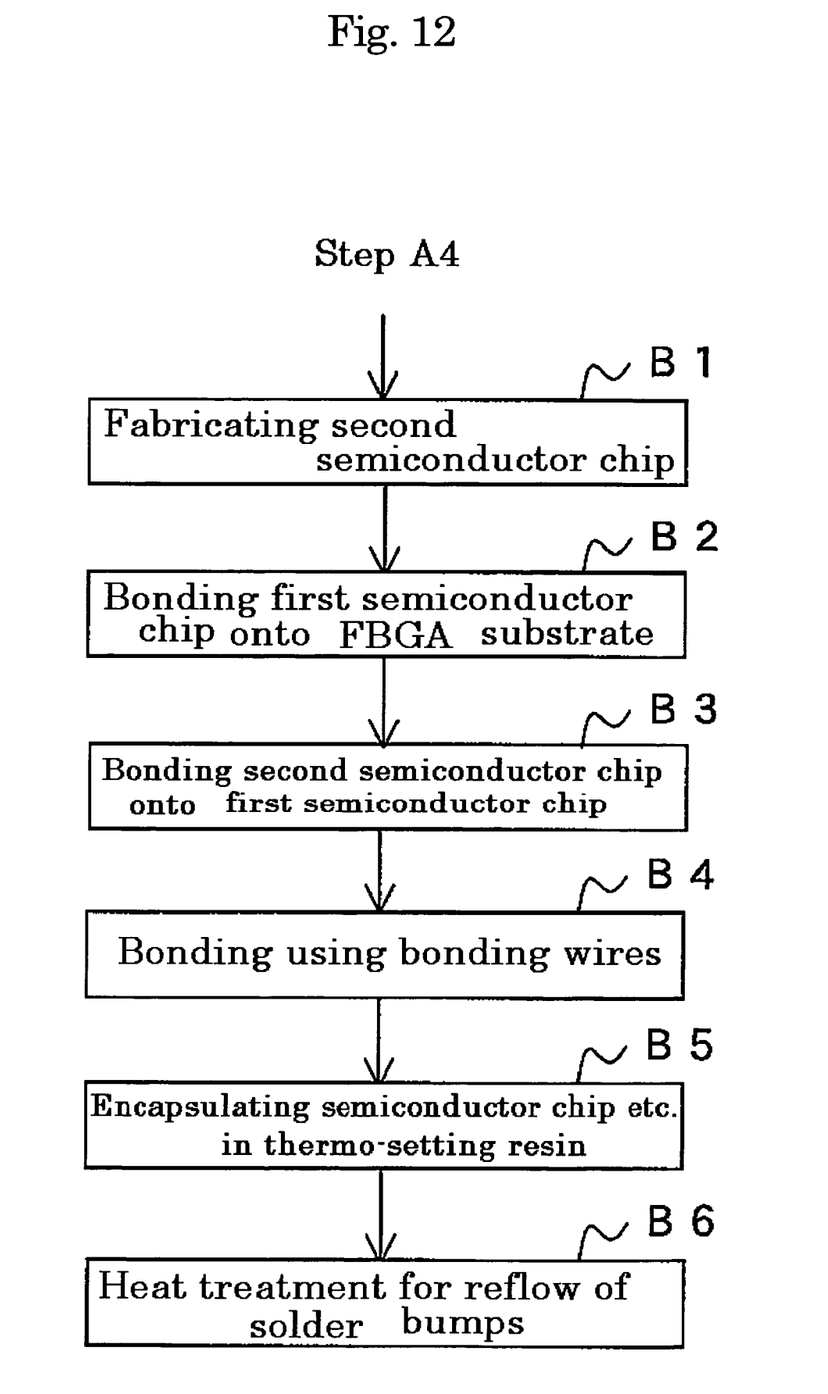
FIG. 12 is a flowchart of a process for manufacturing the semiconductor package of FIG. 11.

FIG. 12 shows a procedure for manufacturing the semiconductor package 30 of FIG. 11. The procedure of FIG. 12 follows the steps A1 to A4 shown in FIG. 4 for preparing the first semiconductor chip 33. In the step A3 of FIG. 4 for manufacturing the first semiconductor chip 33, the polishing system 40 is replaced by another polishing system as detailed below.

Figure 13:
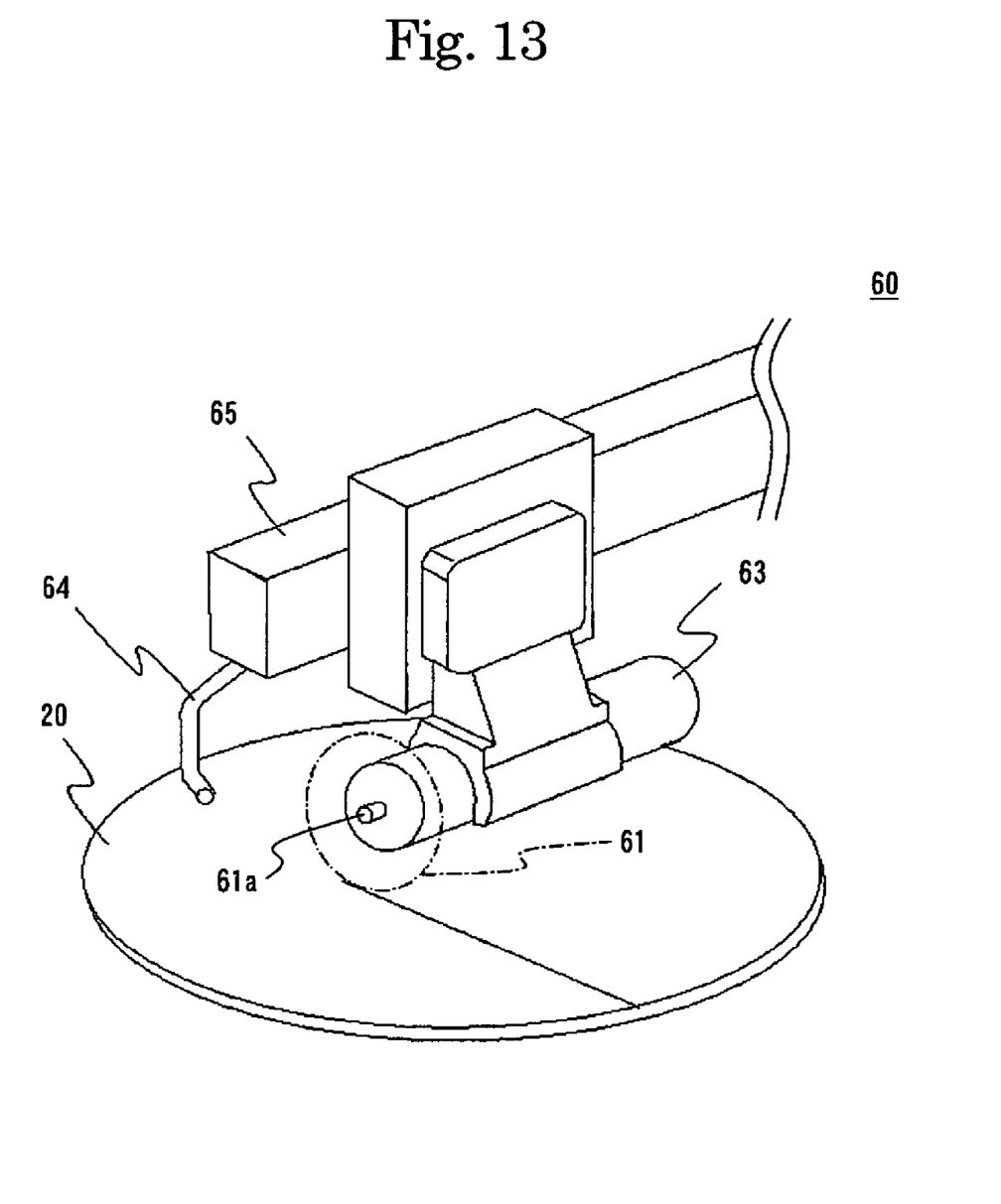
FIG. 13 is a perspective view of another polishing system for polishing the wafer in the process of FIG. 12.
Figure 14A:
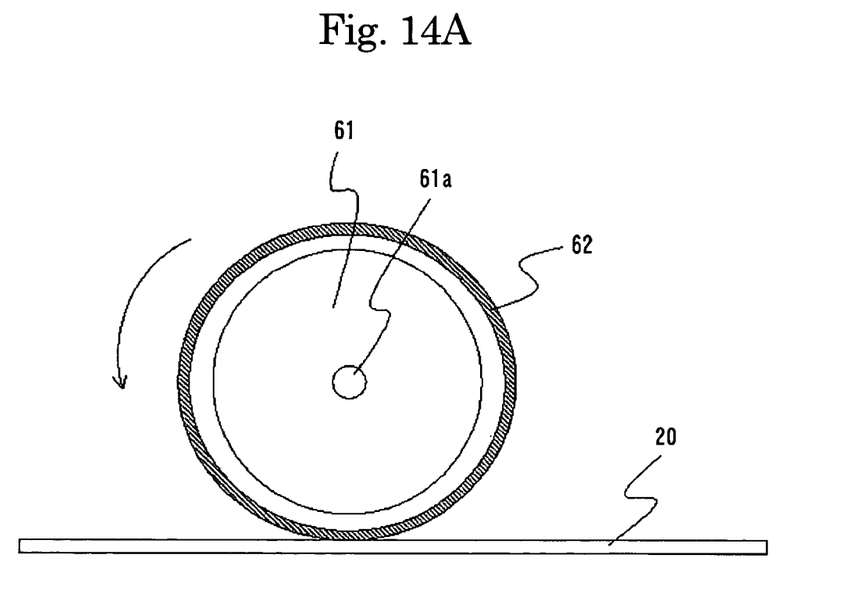
FIG. 14A is a side view of the blade in the polishing system shown in FIG. 13.
Figure 14B:
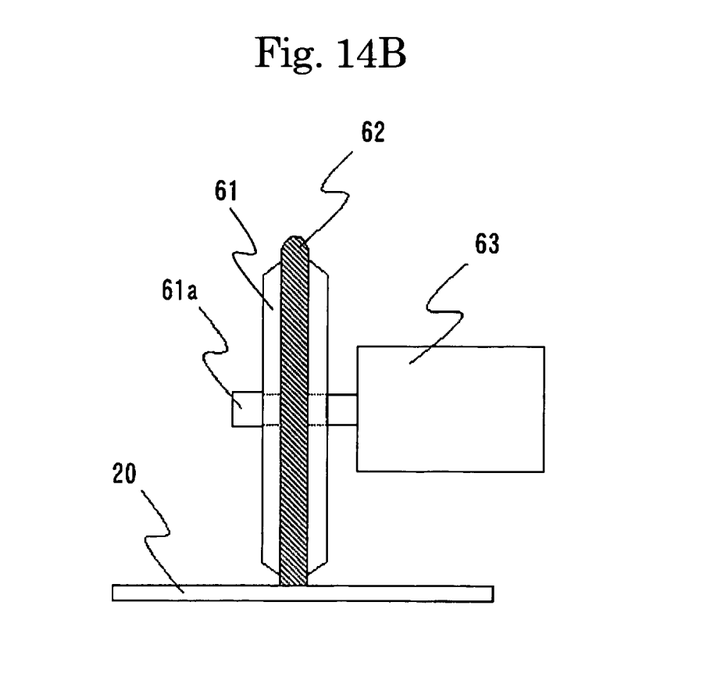
FIG. 14B is a front view of the blade in the same polishing system.
Figure 15:
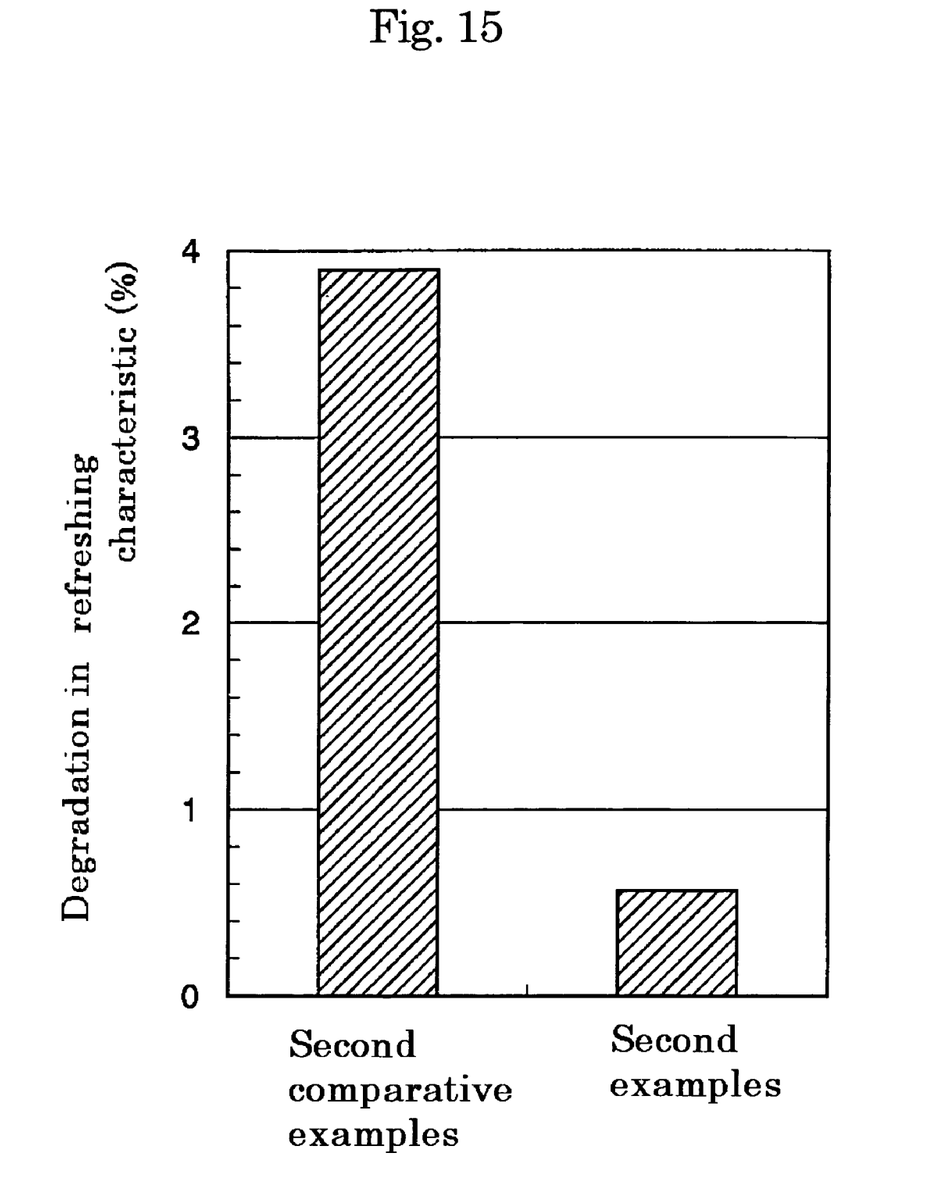
FIG. 15 is a graph showing degradation in the refreshing characteristics of DRAMs of the second examples and second comparative examples.

FIG. 13 shows the polishing system 60 in a perspective view. FIGS. 14A and 14B show the disk blade of the polishing system of FIG. 14A in a side view and a front view, respectively. The polishing system 60 includes the disk blade 61 having a rotational axis 61a, a polishing pad 62 attached onto the periphery of the disk blade 61, a drive motor 63 for rotating the disk blade 61, a slurry supply tube 64 supplying therethrough slurry onto the wafer 20 and, a support arm supporting the motor 63 and the slurry supply tube 64. The polishing system also includes a wafer table (not shown) which is movable in the direction of the plane of the disk blade 61. The polishing pad 62 is made of nonwoven fabric polyester, and has a width of 80 micrometers which is equal to the width of the peripheral scribe area 22.

For polishing the bottom surface of the wafer 20, the wafer 20 is mounted on the wafer stage, with the bottom surface thereof being directed upward. Slurry is then supplied through the slurry supply tube 64 onto the wafer 20, the disk blade 61 is rotated with the polishing pad 62 in contact with the bottom surface of the wafer 20, and the wafer stage is slowly moved in the direction along the disk blade 61.

In the present embodiment, the rotational speed of the disk blade 61 is 100 rmp., the pressure applied by the polishing pad 62 onto the wafer is 200 gram/cm$^2$, and the moving speed of the wafer stage is 20 mm/sec., whereby the wafer 20 is polished in an amount of 2 micrometers in the thickness direction thereof. After the wafer 20 is polished in one direction of the wafer, the wafer is rotated by 90 degrees in the horizontal plane, to allow the polishing system to polish the scribe area extending in a direction normal to the one direction. A dry polishing step may be used instead of the described polishing step using the slurry.

Subsequent to step A4, the second semiconductor chip 35 is fabricated using a known process (step B1). While maintaining the substrate temperature at 180 degrees C., the first semiconductor chip 33 is bonded onto the top surface of the FBGA substrate 31 via the bonding tape 32 (step B2). Thereafter, the second semiconductor chip 35 is bonded onto the first semiconductor chip 33 via the bonding tape 34 (step B3).

Subsequently, electrodes on the first and second semiconductor chips 33 and 35 are connected to electrodes on the FBGA substrate 31 by using bonding wires 36 at a substrate temperature of 180 degrees C. (step B4). While maintaining the temperature at 180 degrees C., the first and second semiconductor chips 33 and 35 and bonding wires 36 are encapsulated on the FBGA substrate 31 by using thermo-setting resin (step B5). The resultant structure is subjected to a heat treatment at the same temperature for about five hours to cure the resin of the bonding tapes 32 and 34 and the thermo-setting resin, thereby achieving the structure of the semiconductor package 30. After the curing step, a heat treatment is effected to reflow the solder bumps 37 of the FBGA substrate 31 to mount the semiconductor package on a printed circuit board (step B6).

In manufacture of the semiconductor package of the present embodiment, the heavy metals attached onto the bottom surface of the silicon substrate of the first semiconductor chip 33 are prevented from diffusing toward the source/drain regions of the silicon substrate during the heat treatments for curing the resin of the bonding tapes 32 and 34 and thermo-setting resin 36, bonding the electrodes by using a wire bonding technique, and reflow of the solder bumps. The second semiconductor chip 35 may be also subjected to a polishing treatment of the peripheral scribe area without polishing the central circuit area. It will be understood that the polishing system used for the present embodiment is only an example and thus may be replaced with another polishing device or the polishing system of FIG. 4.

Samples of semiconductor packages of the second embodiment as described above were manufactured as second examples of the present invention, and other samples were also manufactured as second comparative examples, in which the first semiconductor chip was subjected to a polishing treatment over the entire bottom surface of the wafer. The refreshing characteristics of the second examples and second comparative examples were investigated to obtain the graph of FIG. 10.

The percent degradation in the refreshing characteristic is plotted on the ordinate for the first examples and the first comparative examples. As understood from FIG. 19, the first examples of the semiconductor package of the present invention had a percentage degradation in the refreshing characteristic as low as 0.6% whereas the first comparative examples had a percentage degradation in the refreshing characteristic as high as about 3.9%. This means that the present invention reduced the degradation in the refreshing characteristic of the memory device formed as first example of the present invention.

Since the above embodiments are described only for examples, the present invention is not limited to the above embodiments and various modifications or alterations can be easily made therefrom by those skilled in the art without departing from the scope of the present invention.

What is claimed is:

1. A semiconductor device, comprising a diced semiconductor chip including a central circuit area having a semiconductor active layer and a peripheral scribe area, said peripheral scribe area encircling and contacting an entire circumference of said central circuit area, said peripheral scribe area having a bottom surface having a surface roughness lower than a surface roughness of a bottom surface of said central circuit area.

2. The semiconductor device according to claim 1, wherein said diced semiconductor chip has a thickness not larger than 130 micrometers.

3. The semiconductor device according to claim 1, wherein said bottom surface of said peripheral scribe area comprises a polished surface, and said bottom surface of said central scribe area comprises a mechanically ground surface.

4. The semiconductor device according to claim 3, wherein said bottom surface of said central circuit area has a central-line surface average roughness not lower than 50 nm, and said bottom surface of said peripheral scribe area has a central-line surface average roughness lower than 50 nm.

5. The semiconductor device according to claim 1 wherein said semiconductor device comprises a semiconductor memory device.

6. A silicon wafer, comprising:

a silicon substrate; and a plurality of semiconductor packages formed on the silicon substrate, wherein a bottom surface of the silicon substrate is ground and a peripheral scribe area encircling an entire circumference of each of the plurality of semiconductor packages on the bottom surface of the silicon substrate is polished to a polished fine surface, and wherein the bottom surface of the silicon substrate area has a central-line surface average roughness not lower than 50 nm, and the bottom surface of the peripheral scribe area has a central-line surface average roughness lower than 50 nm.

7. The silicon wafer of claim 6, further comprising a protective sheet bonded to the bottom surface of the silicon substrate.

8. The silicon wafer of claim 6, further comprising a protective sheet associated with a top surface of the silicon substrate.

9. The silicon wafer of claim 6, wherein the semiconductor packages comprise:

a plurality of transistors associated with the silicon substrate;

a plurality of interconnections associated with the silicon substrate; and a plurality of interlevel dielectric films associated with the silicon substrate, the interconnections, and the transistors.

10. The silicon wafer of claim 9, wherein the plurality of transistors comprise metal insulator-semiconductor transistors.

11. The silicon wafer of claim 6, further comprising a protective film formed on the semiconductor packages.

12. The silicon wafer of claim 6, wherein the plurality of semiconductor packages comprise a dynamic random access memory.

13. The silicon wafer of claim 6, wherein the plurality of semiconductor packages comprise a fine-pitch ball-grid-array multichip package.

14. The silicon wafer of claim 6, wherein the peripheral scribe area has a polished thickness of 2 micrometers.

* * * * *